(12) United States Patent
Regier

(10) Patent No.: US 9,294,057 B2
(45) Date of Patent: Mar. 22, 2016

(54) EFFICIENT LOW NOISE HIGH SPEED AMPLIFIER

(71) Applicant: NATIONAL INSTRUMENTS CORPORATION, Austin, TX (US)

(72) Inventor: Christopher G. Regier, Cedar Park, TX (US)

(73) Assignee: National Instruments Corporation, Austin, TX (US)

( * ) Notice: Subject to any disclaimer, the term of this patent is extended or adjusted under 35 U.S.C. 154(b) by 48 days.

(21) Appl. No.: 14/133,317

(22) Filed: Dec. 18, 2013

(65) Prior Publication Data

US 2015/0171793 A1 Jun. 18, 2015

(51) Int. Cl.
*H03F 3/26* (2006.01)
*H03F 3/217* (2006.01)
*H03F 3/21* (2006.01)
*H03F 3/187* (2006.01)
*H03F 1/26* (2006.01)

(52) U.S. Cl.
CPC ............. *H03F 3/2171* (2013.01); *H03F 1/26* (2013.01); *H03F 3/187* (2013.01); *H03F 3/211* (2013.01); *H03F 3/2173* (2013.01); *H03F 2200/261* (2013.01); *H03F 2200/432* (2013.01)

(58) Field of Classification Search
CPC .................................. H03F 3/26; H03F 3/217

USPC .................. 330/146, 251, 207 A, 10
See application file for complete search history.

(56) References Cited

U.S. PATENT DOCUMENTS

| | | | |
|---|---|---|---|
| 2009/0115514 A1* | 5/2009 | Maejima et al. | 330/251 |
| 2009/0160551 A1* | 6/2009 | Chen et al. | 330/251 |
| 2009/0302943 A1* | 12/2009 | Chen et al. | 330/251 |
| 2011/0063027 A1* | 3/2011 | Kishii et al. | 330/251 |
| 2012/0154044 A1* | 6/2012 | Hirano et al. | 330/251 |

* cited by examiner

*Primary Examiner* — Henry Choe
(74) *Attorney, Agent, or Firm* — Meyertons Hood Kivlin Kowert & Goetzel, P.C.; Jeffrey C. Hood; Brian E. Moore

(57) ABSTRACT

A hybrid amplifier includes a linear amplifier coupled in series with a switching amplifier. The linear amplifier may generate an intermediate amplified signal according to an input signal. The switching amplifier may generate an output signal according to the intermediate amplified signal, the output signal having an amplitude with respect to a reference voltage provided at a reference node. The linear amplifier may drive the reference node to adjust the reference voltage responsive to transient changes in the output signal. A high-pass filter coupled to the linear amplifier and the switching amplifier may enable the switching amplifier to provide most of the steady-state current, which may drive a load, from actual ground. The linear amplifier and switching amplifier may be independently powered, for example from a power supply having a primary winding and two electrically isolated secondary windings that respectively provide power to the linear amplifier and the switching amplifier.

32 Claims, 6 Drawing Sheets

EFFICIENT LOW NOISE HIGH SPEED AMPLIFIER

BACKGROUND OF THE INVENTION

1. Field of the Invention

This invention relates generally to the design of amplifiers and, more particularly, to the design of efficient, low-noise, high-speed amplifiers.

2. Description of the Related Art

Electronic amplifiers are used for increasing the power and/or amplitude of various specified signals. Most amplifiers operate by sinking current from a power supply, and controlling the output signal to match the shape of the input signal, but having a higher amplitude. Amplifiers are typically specified according to their input and output characteristics. One of the main characteristics of an amplifier is its gain, which relates the magnitude of the output signal to the magnitude of the input signal. The gain may be specified as the ratio of the output voltage and the input voltage, or the ratio of the output power and the input power. The gain relationship is oftentimes expressed as the transfer function of the amplifier. In most cases, the transfer function of an amplifier is expected to be linear, that is the gain is expected to be constant for any combination of input and output signals. While linear amplifiers respond to different frequency components independently, and do not generate harmonic distortion, nonlinear amplifiers are oftentimes affected by distortion. Overall, if the transfer function or gain is not linear, the output signal may become distorted. There are many classifications addressing different amplifier design considerations, oftentimes defining particular relationships between the design parameters and the objectives of a given circuit. Various power amplifier circuit (output stage) classifications exist for analog designs (class A, B, AB and C for example), and for switching designs (class D and E for, example) based upon the conduction angle or angle of flow, $\Theta$, of the input signal through the amplifying device—that is, the portion of the input signal cycle during which the amplifying device is conducting. The conduction angle is closely related to the amplifier power efficiency, and the image of the conduction angle may be derived from amplifying a sinusoidal signal (e.g. if the device is always on, $\Theta=360°$.) Amplifier design typically requires a compromise between numerous factors, such as cost, power consumption, device imperfections, and a large number of performance specifications.

Many systems, including audio systems, measurement and data acquisition (DAQ) systems, some of which are PC-based, plug-in boards, radio frequency transmission systems, and control systems make use of amplifiers. For example, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT. Oftentimes however, the received signal is small relative to the dynamic range that is typical of ADCs. That is, the measured signal may have a small dynamic range, for example on the order of tens of mV in some systems. Therefore it is oftentimes required to further process the measured signal in order to match the dynamic range of ADCs. To achieve this, the measurement instruments may include switchable amplifiers to scale the measured signal to a level appropriate for the ADC or RMS-to-DC converter used in the measurement.

A power amplifier is typically considered to be the last amplifier in a transmission chain (the output stage), representing the amplifier stage for which power efficiency is a most important factor. The efficiency considerations for power amplifiers resulted in the definitions for a variety of different classes of power amplifiers, based at least in part on the biasing of the output transistors. As mentioned above, power amplifiers are classified as A, B, AB and C for analog designs, and class D and E for switching designs, among others, with additional classes including class G, for example. Class AB and G amplifiers are typically fast and quiet, that is, they produce a mostly noise-free output signal. Class D amplifiers are efficient but are also typically slow and noisy, that is, they produce an output signal that is not noise-free. It is possible to design low-noise, high-speed, and high-efficiency amplifiers by attempting to combine the best features of both topologies. However, the design of such amplifiers at present time is complex, and yields only partially successful results with respect to the goal of obtaining the best possible combination of the best features of the two topologies.

Other corresponding issues related to the prior art will become apparent to one skilled in the art after comparing such prior art with the present invention as described herein.

SUMMARY OF THE INVENTION

As previously mentioned, the best characteristic of class AB and G amplifiers is their fast and quiet operation. In contrast, class D amplifiers are efficient but slow, and produce a noisy output. In a typical prior art series-hybrid-linear amplifier, the power supply voltages are expected to remain as close in value to the output as possible. Therefore, a class D switching amplifier is typically configured to drive the supply rails of the linear stage, which forces the supply rails to closely track the output signal (output voltage), which prevents excessive power consumption in the linear stage. In essence, the linear stage is positioned at the output of the class D amplifier, absorbing the ripple (noise) appearing on the output. However, most present day amplifiers that attempt to combine the best features of both topologies—i.e. low-noise, high-speed, and high-efficiency—are complex and only partially successful at achieving the desired speed, efficiency, and noise-free operation.

Various embodiments of an amplifier architecture disclosed herein achieve low-noise, high-speed, and high-efficiency operation without requiring excessive complexity. Prior art solutions typically combine linear amplifiers (Class AB or G) and switching amplifiers (Class D) in a series or parallel arrangement in which the linear stage delivers high current at low voltage, or high voltage at low current, but not high current and high voltage at the same time. In such arrangements, the switching amplifier delivers the bulk of the output power.

The various embodiments of the amplifier architecture disclosed herein differ from prior art amplifiers in at least two key areas. First, a switching amplifier is electrically isolated from a linear amplifier, and the output of the linear amplifier is used to provide the signal reference to the floating switching amplifier, instead of the signal reference of the switching amplifier being provided by an actual reference (e.g. ground). This simplifies coupling the two amplifiers in series, and obviates the need to provide a high-voltage power supply to the linear amplifier. As a result of the electrical isolation the linear amplifier does not require a high-voltage power supply.

In one set of embodiments, the electrical isolation may be achieved by independently powering the two amplifiers. Second, rather than the linear amplifier stage delivering the full load-current—which is typically the case for series-configured hybrid amplifiers—the output of the linear amplifier may be high-pass filtered, allowing the (majority of the steady-state) output current to flow through an inductor almost without loss from ground. More specifically, the high-pass filter may include an inductor coupled across the output of the linear amplifier stage and an actual signal/voltage reference (e.g. ground), allowing the output current to flow through the inductor. These two structural improvements result in a circuit that is relatively simple while delivering the promised benefits of a hybrid switching/linear power amplifier.

Typically, a switching amplifier imposes a certain voltage between two nodes at its output, where one of the two nodes is the output node, and the other node is generally ground, also referred to herein as "actual ground". Accordingly the output voltage is the potential difference between the output node and ground. In various embodiments, the output generated by a floating switching stage in a hybrid amplifier may be referenced to and regulated with respect to a reference that may be adjusted using a linear stage in the hybrid amplifier, to maintain an output with substantially reduced noise (or a noise-free output) with respect to ground. In this manner, any noise (also referred to herein as ripples and/or transients) that may be present in the output signal (provided by the switching stage) may be counteracted by the linear stage driving the reference node. In other words, the output may be referenced to the output of the linear stage, which may move the value of the reference, and therefore the value of the output signal, according to noise/transients generated on the output signal, to counteract and eliminate the noise on the output signal. The amplitude (or voltage value) of the output signal provided the hybrid amplifier, for example to a load, is still with respect to actual ground, but by allowing the switching stage to float with respect to actual ground, noise on the output of the hybrid amplifier may be counteracted in an efficient manner. This may be accomplished by sensing the output of the switching stage through a feedback loop to the input of the linear stage, which therefore allows compensating for the noise on the output of the switching stage.

In various embodiments, an amplifier structure may include a switching amplifier that generates a first amplified output signal having an amplitude with respect to a reference value at a reference node, and may further include a linear amplifier coupled to the switching amplifier and generating a second amplified output signal. The linear amplifier may adjust the reference value at the reference node, for example by driving the reference node with the second amplified output signal, to counteract transients and/or noise generated on the first amplified output signal. The switching amplifier may drive a load with the first amplified output signal, and may adjust the amplitude of the first amplified output signal according to at least the second amplified output signal. Specifically, the switching amplifier may increase the amplitude of the first amplified output signal when the second amplified output signal has a positive amplitude with respect to actual ground, and/or it may decrease the amplitude of the first amplified output signal when the second amplified output signal has a negative amplitude with respect to actual ground.

In one set of embodiments, the linear amplifier and the switching amplifier are powered by respective power supplies that are electrically isolated from each other. In another set of embodiments, the amplifier structure may include a power supply having a a primary winding, and a first secondary winding configured to provide power to the linear amplifier according to a current developed in the primary winding, and further having a second secondary winding electrically isolated from the first secondary winding and configured to provide power to the switching amplifier according to the current developed in the primary winding. Furthermore, the switching amplifier may include a full-bridge structure with matched output inductors, and a feedback path provided from an output of the switching amplifier—where the first amplified output signal is provided—to an input of the linear amplifier. The linear amplifier may receive a feedback signal through the feedback path, and adjust the reference value at the reference node according to at least the received feedback signal.

In some embodiments, a hybrid amplifier may be designed to have an input terminal that receives an input signal, and an output terminal that provides an output signal having an amplitude with respect to a reference voltage. The hybrid amplifier may include a linear amplifier stage that generates an intermediate amplified signal based on the input signal, and adjusts the reference voltage responsive to transient changes in the output signal. A resistive feedback path provided from the output terminal to the input of the linear amplifier may enable the linear amplifier stage to sense the transient changes in the output signal. A switching amplifier stage coupled to the linear stage may generate the output signal based on the intermediate amplified signal, and provide the output signal at the output terminal. The reference voltage may be provided at a reference node, and the linear amplifier stage may adjust the reference voltage by driving the reference node with the intermediate amplified output signal. The hybrid amplifier may be operated to drive a load with the output signal, and may increase the amplitude of the output signal when the intermediate amplified signal has a positive amplitude with respect to actual ground, and decrease the amplitude of the output signal when the intermediate amplified signal has a negative amplitude with respect to actual ground.

The linear amplifier stage and the switching amplifier stage may be powered independently from each other, which may be achieved by powering the two amplifier stages with a power supply having a primary winding, a first secondary winding powering the linear amplifier stage according to a current developed in the primary winding, and a second secondary winding electrically isolated from the first secondary winding and powering the switching amplifier stage according to the current developed in the primary winding. The switching amplifier stage may include a full-bridge structure having matched output inductors. The hybrid amplifier may also include a high-pass filter coupled to an output of the linear amplifier stage where the intermediate amplified signal is provided, a reference node where the reference voltage is provided, and actual ground. The high-pass filter enables the switching amplifier stage to provide at least a specified portion of the steady-state current directly from the actual ground. In some embodiments, the high-pass filter includes an inductor coupled across the reference node and the actual ground, and a capacitor coupled across the output of the linear amplifier and the reference node, with the specified portion of the steady-state current provided by the inductor.

Other aspects of the present invention will become apparent with reference to the drawings and detailed description of the drawings that follow.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
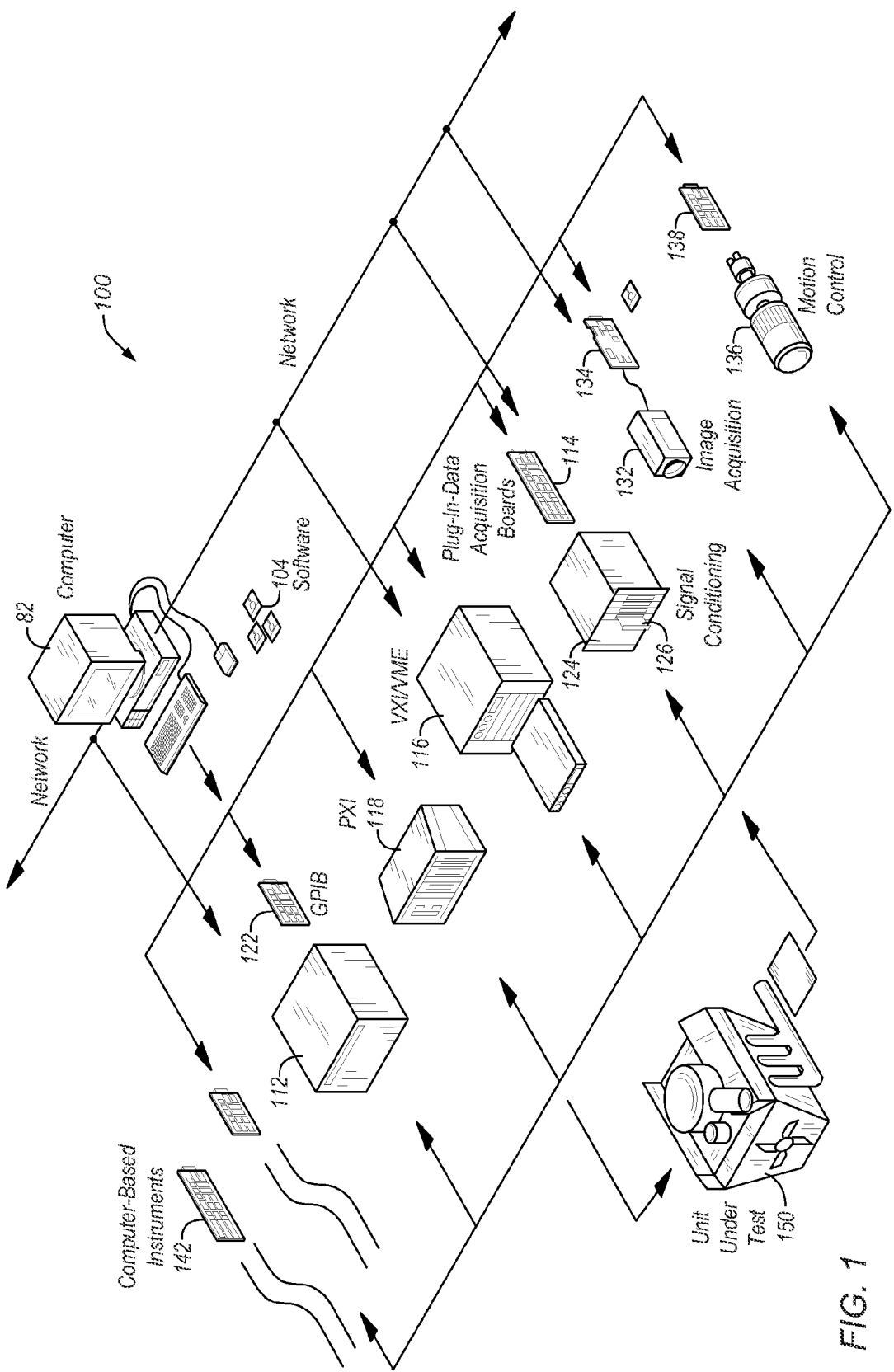
FIG. 1 shows an instrumentation control system with instruments networked together according to one embodiment of the invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "comprise", and derivations thereof, mean "including, but not limited to". The term "coupled" means "directly or indirectly connected".

DETAILED DESCRIPTION OF THE EMBODIMENTS

Embodiments of a low-noise, efficient, high-speed amplifier described herein may be used in various test and measurement systems, or any other system that may benefit from signal amplification. More specifically, they may be used in various instances where a high-speed, efficient, low-noise amplifier may be required, for example in instrumentation and/or measurement equipment, audio applications, etc. However, it is noted that various embodiments may equally be used for a variety of other applications, and such applications are not intended to be limited to those enumerated above. In other words, applications discussed in the present description are exemplary only, and various embodiments of a low-noise, efficient, high-speed amplifier with a linear stage and a switching stage coupled in series as disclosed herein may be used in any of various types of systems.

FIG. 1 illustrates an exemplary instrumentation control system 100 which may be configured according to embodiments of the present invention and may benefit from the use of low-noise, efficient, high-speed amplifiers. System 100 comprises a host computer 82 which may couple to one or more instruments configured to perform a variety of functions using various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices, one or more of which may include embodiments of efficient, low-noise, high-speed amplifiers described herein.

The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
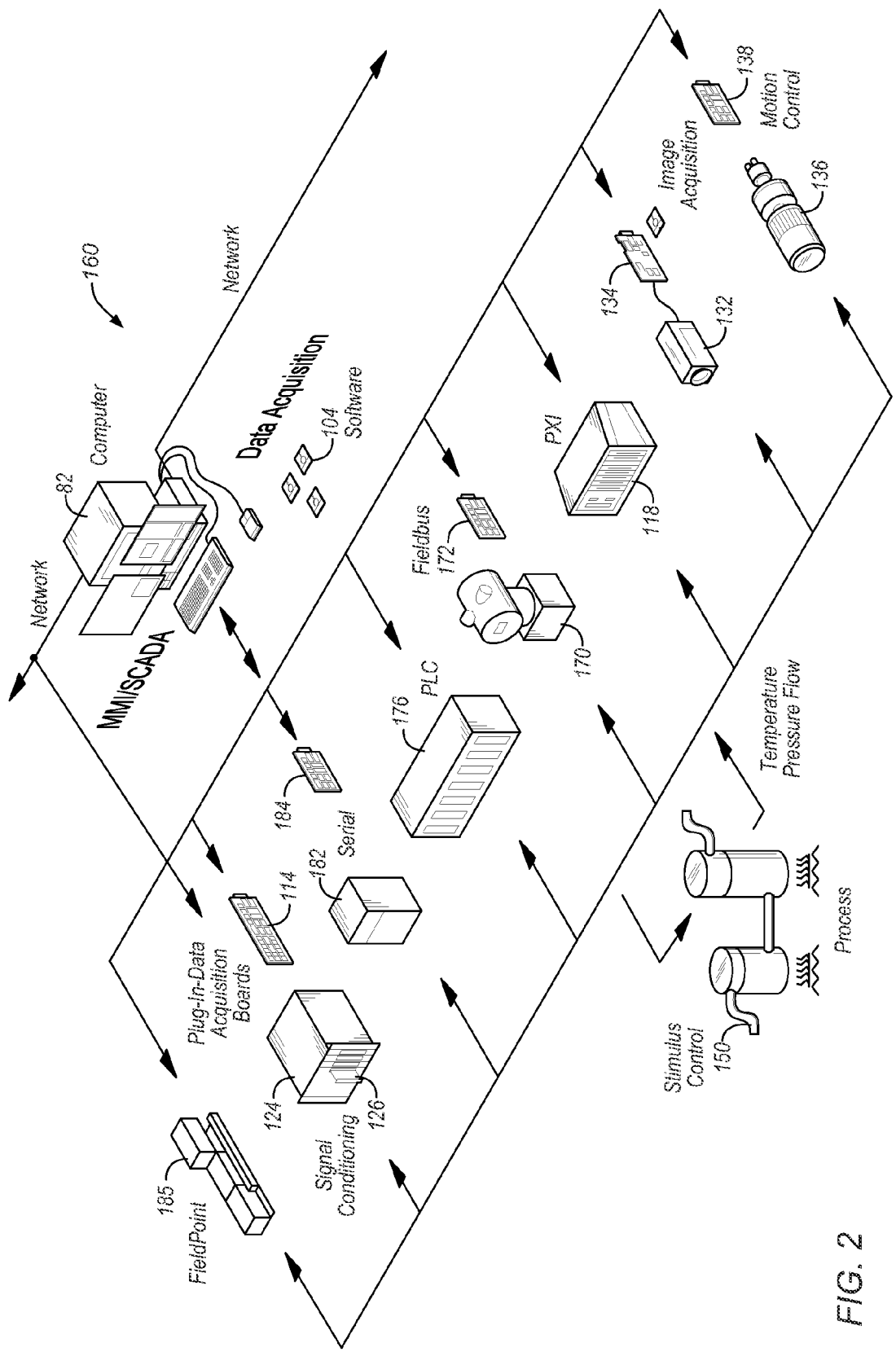
FIG. 2 shows an industrial automation system with instruments networked together according to one embodiment of the invention.

FIG. 2 illustrates an exemplary industrial automation system 160 that may include various embodiments of the present invention. Industrial automation system 160 may be similar to instrumentation or test and measurement system 100 shown in FIG. 1. Elements that are similar or identical to elements in FIG. 1 have the same reference numerals for convenience. System 160 may comprise a computer 82 which may couple to one or more devices and/or instruments configured to perform a variety of functions using efficient, low-noise and high-speed amplifiers implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection.

Figure 3:
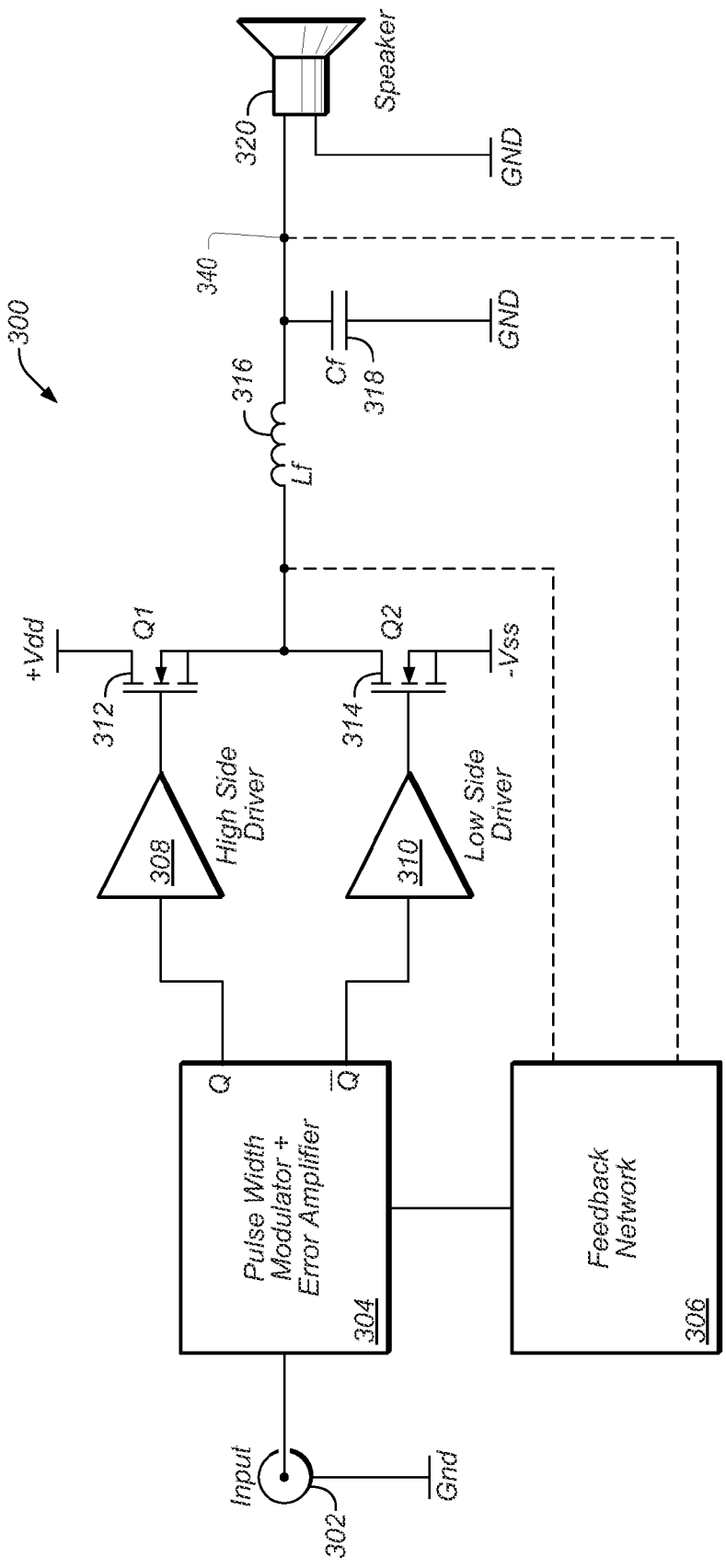
FIG. 3 shows a simplified circuit diagram of a prior art example of a class D switching amplifier.

FIG. 3 shows a simplified circuit diagram of a prior art example of a class D switching amplifier 300. As shown in FIG. 3, amplifier 300 is a PWM (pulse width modulated) switching amplifier with output filtering. Input signal 302 is provided to a PWM and Error Amplifier block 304 that generates the control values for the drive signals provided to the output stage, which includes a high-side FET (field effect transistor) 312 receiving a drive signal from driver circuit 308, and a low-side FET 314 receiving a drive signal from driver circuit 310. The output from the output stage is filtered using inductor 316 and capacitor 318, with the resulting filtered signal driving a load, for example a speaker 320 as shown. Amplifier 300 may be designed using an open loop structure, or alternatively, provide feedback (represented as feedback network 306) from either the output of the output stage or from the output providing the filtered output signal (i.e. node 340). It should be noted that if the circuit is compensated in order to allow the feedback signal (via network 306) to be provided from node 340, the gain may need to be decreased to such a level that the loop gain becomes low, which may compromise the fidelity of the amplifier. It would be desirable to obtain the performance of a class AB amplifier with the efficiency of a class D amplifier.

Figure 4:
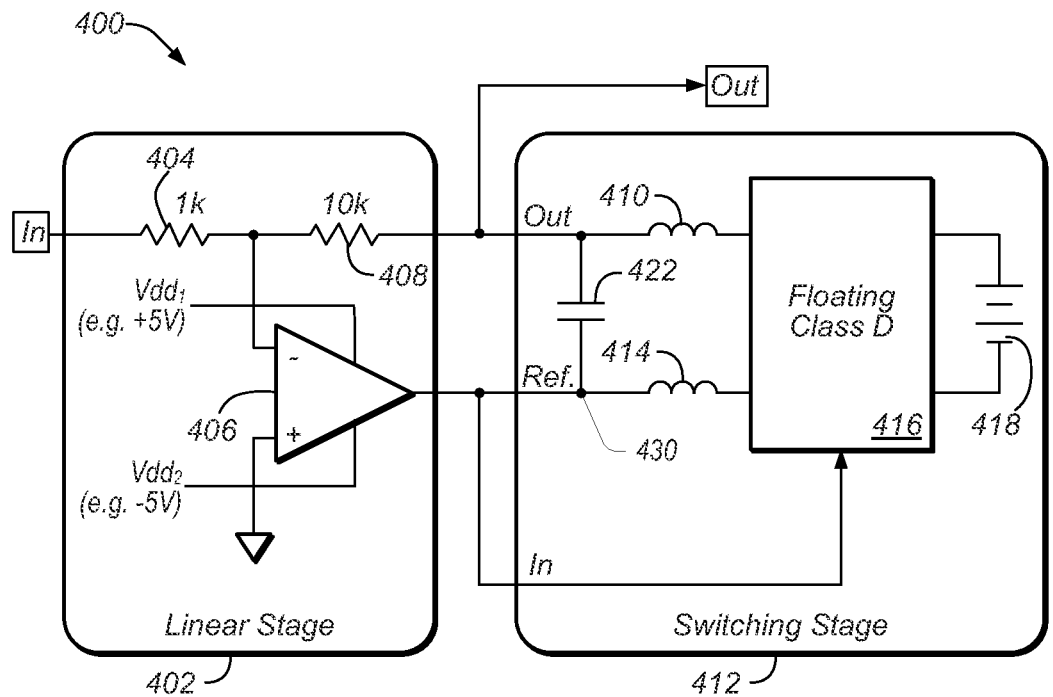
FIG. 4 shows a simplified circuit diagram of a first embodiment of an efficient, low-noise, high-power hybrid amplifier according to principles of the present invention.

FIG. 4 shows a simplified circuit diagram of a first embodiment of an efficient, low-noise, and high-power hybrid amplifier 400, which may provide an output voltage "Out", for example to a load (not shown). A linear (amplifier) stage 402 is series coupled to a switching (amplifier) stage 412. The output of switching stage 412 is provided by a class D amplifier component 416, which is powered by a floating supply 418. The output (Out) is referenced to a reference node 430 at one end of output capacitor 422, which is coupled to inductors 410 and 414 as shown. Because switching stage 412 is regulating its output voltage with respect to Ref node 430 as opposed to regulating its output with respect to actual (signal) ground, the output is in effect referenced to the output of the linear stage 402 provided by the output of operational amplifier 406. Thus, the linear stage 402 may be operated to adjust the reference voltage at node 430 according to noise generated on the output of switching stage 412 to counteract and eliminate the noise on the output signal "Out". This may be accomplished by sensing the output of the switching stage (i.e. the output of amplifier 400), for example, by providing a feedback path—via resistor 408—from the output of switching stage 412 to the input of operational amplifier 406. The input signal may be provided to operational amplifier 406 through an input resistor 404. It should be noted that the resistor values and supply voltage values are provided as examples for one embodiment, and the various embodiments described are not limited to those values. In addition, while the feedback path is shown with resistor 408, alternative embodiments may include different implementations of the feedback path, so long as a proper feedback from the output of switching stage 412 (and therefore from the output of hybrid amplifier 400) is provided to the input of linear stage 402.

By adjusting the reference voltage value at node 430, linear stage 402 can effectively compensate for any noise or transient developed at the output. For example, if the goal is to generate 60V/1 A at the output, the switching stage 412 may be generating 60V, with the output of the linear stage 402 counteracting the noise (residing at around 0V). In the case of amplifier 400, the current (1 A, representative of the steady-state current) is provided by the linear stage 402. As is normal with a series connection, both amplifier stages (402 and 412) are expected to deliver the output current (i.e. the output current is delivered from linear stage 402 through switching stage 412, while the output voltage is generated by switching stage 412. Capacitor 422 is the output of switching stage 412. As mentioned above, the bottom terminal of the capacitor at node 430 is considered the reference for the output signal generated by switching stage 412. Therefore, if the voltage at node 430 is raised, the output voltage also rises accordingly. In other words, the amplitude of the output voltage is with reference to the value at node 430, and may therefore also be adjusted by adjusting the voltage at node 430. This allows linear stage 402 to compensate for the noise and/or transients that appear at the top of the capacitor, i.e. at the amplifier output (out) by driving node 430.

In addition, switching stage 412 may increase or decrease its output voltage (that is, the output voltage of amplifier 400) according to the output signal provided by linear stage 402 to the input of switching stage 412 as shown. When the voltage level provided by linear stage 402 is high with respect to ground (i.e., actual signal reference for the linear stage and the output), switching stage 412 may begin to increase its duty cycle (using appropriate circuitry and/or components not shown but well known in the art), which increases its output voltage. Similarly, when the voltage level provided by linear stage 402 is negative with respect to ground, the switching stage 412 may decrease the duty cycle, thereby reducing the output voltage. This results in switching stage 412 making adjustments to the output voltage responsive to big, relatively slow output voltage changes, which may be identified as representing voltage changes in a specified first range. In contrast, linear stage 402 may adjust the output voltage responsive to small, fast output changes (either transients or noise that appear on the output). Due to its structure and operation, switching stage 412 cannot easily adjust the voltage at the output (e.g. due to the output being filtered with an LC filter—capacitor 422 and inductor 410). Therefore, while the voltage across the capacitor 422 may not be adjusted very quickly, the voltage at the bottom of the capacitor 422 at node 430 may be adjusted to cause the voltage at the top of the capacitor (at the output) to respond quickly, which makes the fast linear amplifier 402 effective.

Therefore, the output of linear stage 402 may swing/change enough to match any ripple voltage at the output of switching stage 412 by driving node 430 to adjust the reference voltage at node 430, while delivering full output current. Most of the ripple voltage may appear at the output of operational amplifier 406, which has a finite gain at the ripple frequency, resulting in residual ripple noise for the operational amplifier 406. The residual ripple noise may get multiplied by the noise gain, to get referred to the output. Therefore, operational amplifier 406 may be designed to have a high gain, i.e. a high gain bandwidth. Alternately, operational amplifier 406 may be a composite operational amplifier, or it may be designed to be a composite operational amplifier having a high gain bandwidth.

Figure 5:
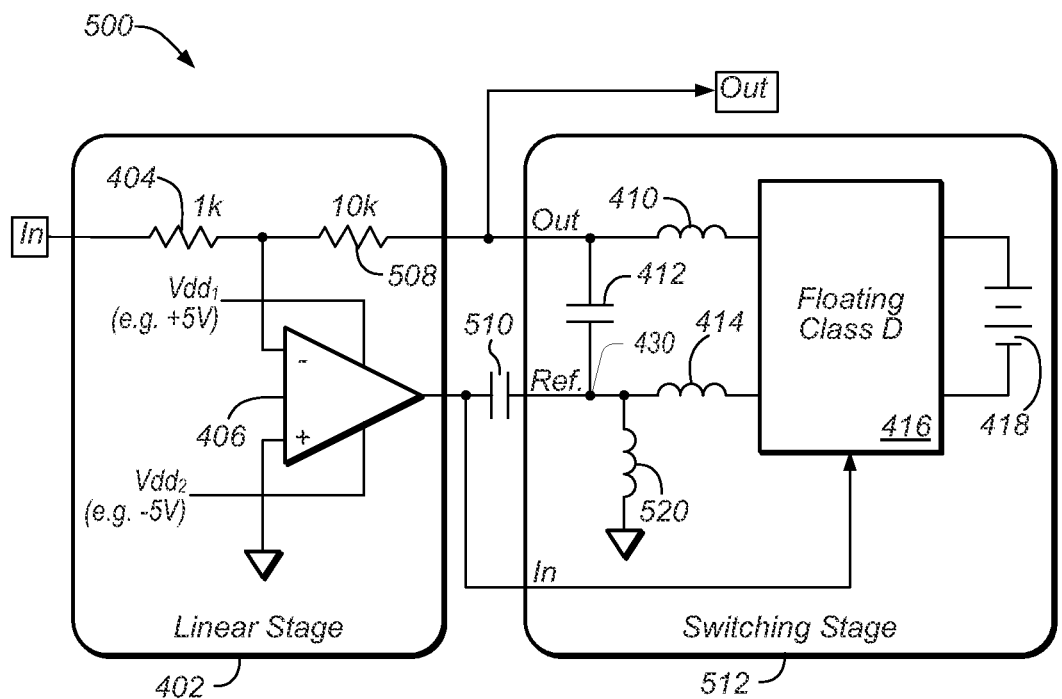
FIG. 5 shows a simplified circuit diagram of a second embodiment of an efficient, low-noise, high-power hybrid amplifier according to principles of the present invention.

FIG. 5 shows a simplified circuit diagram of a second embodiment of an efficient, low-noise, high-power hybrid amplifier 500. As seen in FIG. 5, hybrid amplifier 500 is similar to hybrid amplifier 400, with the exception of slightly modified switching stage 512. Specifically, a high-pass filter including capacitor 510 and inductor 520 may be coupled to the output of linear stage 402, the reference node 430, and actual (signal) ground 520 as shown. By including a high-pass filter, which may be an RLC filter with capacitor 510 and inductor 520 as shown, and a stabilizing resistance provided by a resistance of the output stage of operational amplifier 406), the output current may now be provided directly from the actual voltage reference (ground). Thus, the linear stage 402 may be providing the output current during transients, while in steady-state it may generate a small voltage across the inductor 520, which, in some embodiments, may result in providing a few mA of current in the inductor 520. In contrast to amplifier 400, linear stage 402 in amplifier 500 is not required to provide the entire steady-state output current.

Instead, current during steady-state is coming primarily from the inductor 520 coupled to ground, while linear stage 402 provides enough current to move the voltage at the inductor (i.e. at node 430) up and down to properly adjust the reference voltage at the reference input into the switching stage 512 (at node 430) to counteract the noise on the output (as previously described). The DC output current therefore now primarily flows from actual (voltage and/or signal) ground. In other words, at least a specified amount of the steady-state current may be provide through inductor 520 directly from ground, and that specified amount might represent the majority of the steady-state current. It should be noted that while this arrangement is highly efficient, linear stage 402 is driving a high-pass filter, and a specified amount of current is therefore still provided by linear stage 402 to overcome the ripple voltage on the output.

Figure 6:
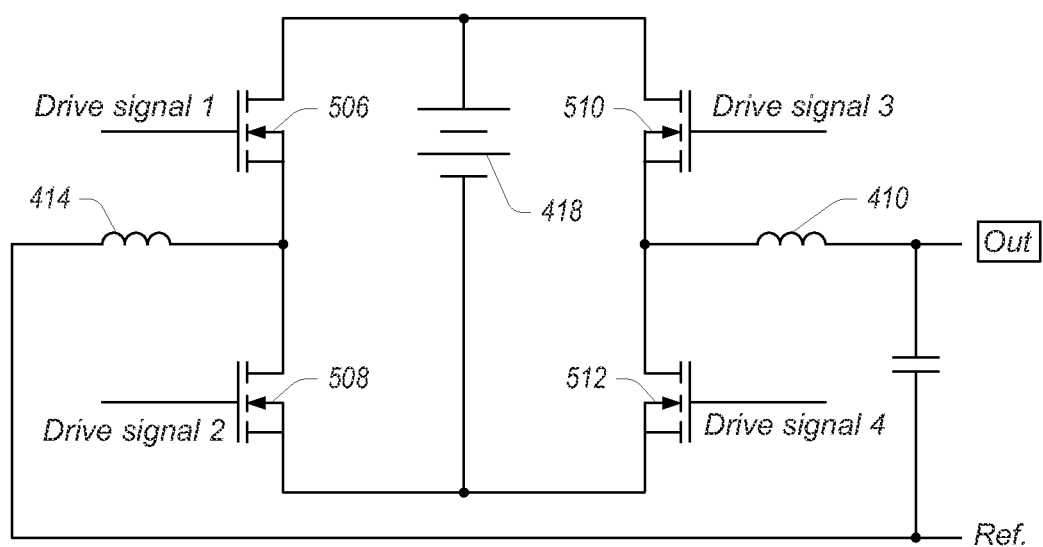
FIG. 6 shows a simplified circuit diagram of one embodiment of full-bridge structure that may included in the switching stage of the amplifiers of FIG. 4 and FIG. 5.

FIG. 6 shows a simplified circuit diagram of one embodiment of full-bridge structure that may included in switching stages 412 and 512. In the full-bridge arrangement shown, transistor devices 506, 508, 510, and 512 may be driven by respective drive signals generated based at least on the value of the output signal provided by linear stage 402.

Figure 7:
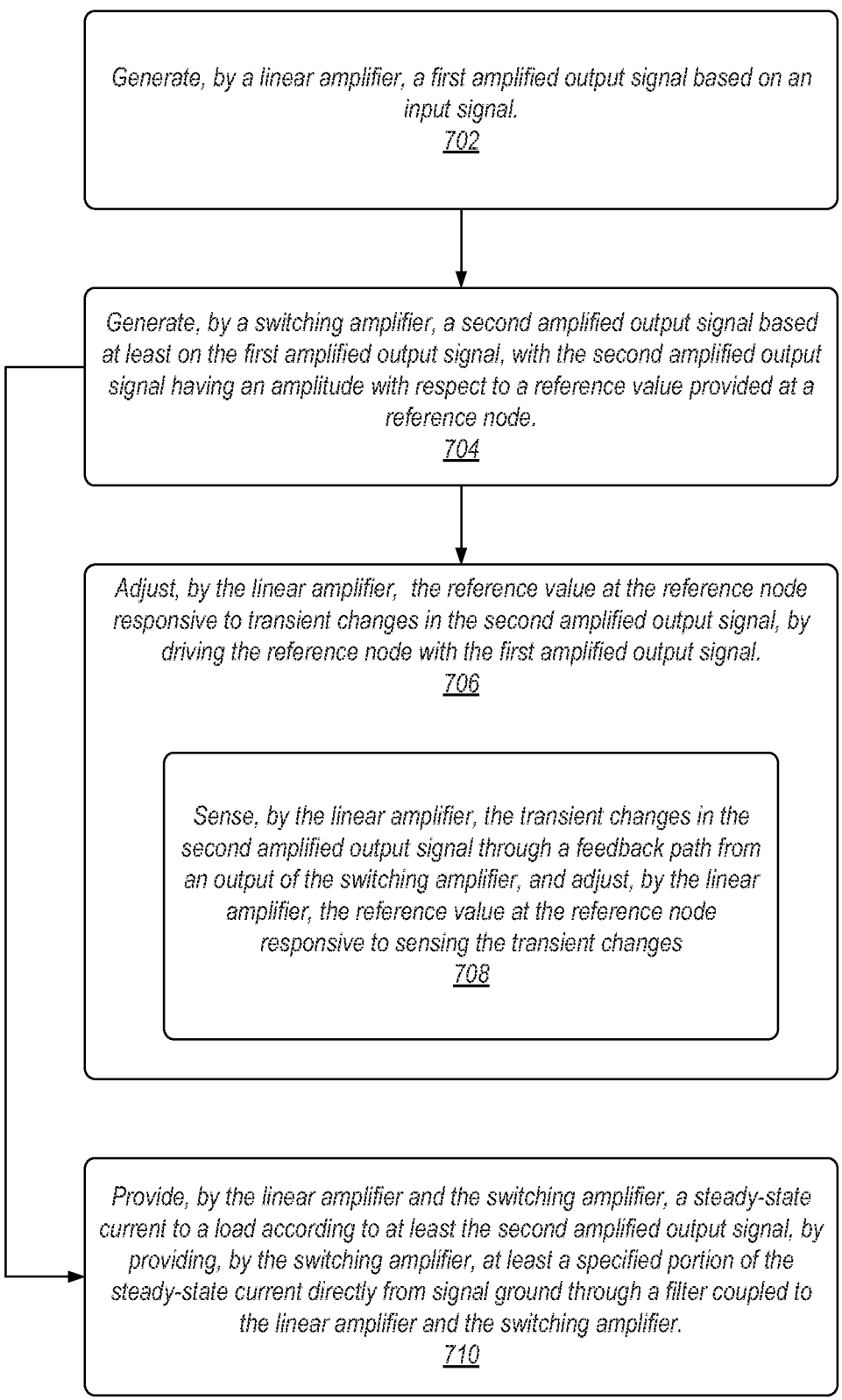
FIG. 7 shows a flow diagram of one embodiment of a method for amplifying an input signal, according to principles of the present invention.

Based on at least the above, a flow diagram representative of one embodiment of a method for amplifying an input signal is provided in FIG. 7. The method may include generating, by a linear amplifier, a first amplified output signal based on an input signal (702), and generating, by a switching amplifier, a second amplified output signal based at least on the first amplified output signal, wherein the second amplified output signal has an amplitude with respect to a reference value provided at a reference node (704). The reference value at the reference node may be adjusted by the linear amplifier responsive to transient changes in the first amplified output signal (706). Adjusting the reference value may be performed by driving, by the linear amplifier, the reference node with the first amplified output signal (706). In one set of embodiments, adjusting the reference value may include sensing, by the linear amplifier, the transient changes in the second amplified output signal through a feedback path from an output of the switching amplifier, and adjusting, by the linear amplifier, the reference value at the reference node responsive to sensing the transient changes (708).

The method may also include providing, by the linear amplifier and the switching amplifier, a steady-state current to a load according to at least the second amplified output signal, which may include providing, by the switching amplifier, at least a specified portion of the steady-state current directly from actual ground through a filter coupled to the linear amplifier and the switching amplifier (710). Specifically, the specified portion of the steady-state current may represent a majority of the steady-state current, which may be provided through an inductor coupled across the reference node and the actual ground. In some embodiments the linear amplifier may be powered by a first power supply, and the switching amplifier may be powered by a second power supply electrically isolated from the first power supply. In alternate embodiments, the linear amplifier and the switching amplifier may both be powered by a single power supply having a primary winding and a couple of electrically isolated secondary windings respectively powering the linear amplifier and the switching amplifier.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. An amplifier structure comprising:
 a switching amplifier configured to generate a first amplified output signal, wherein the first amplified output signal has an amplitude referenced to a value of a reference voltage provided at a reference node for the switching amplifier, wherein the reference voltage provided at the reference node provides a signal reference of the switching amplifier instead of the signal reference of the switching amplifier being provided by actual ground; and
 a linear amplifier coupled to the switching amplifier and configured to:
  generate a second amplified output signal based at least on an input signal; and
  adjust the value of the reference voltage at the reference node, wherein to adjust the value of the reference voltage at the reference node, the linear amplifier is further configured to drive the reference node with the second amplified output signal.

2. The amplifier structure of claim 1, wherein the switching amplifier is further configured to drive a load with the first amplified output signal.

3. The amplifier structure of claim 1, wherein the linear amplifier is further configured to provide the second amplified output signal to the switching amplifier;
 wherein the switching amplifier is further configured to adjust the amplitude of the first amplified output signal according to at least the second amplified output signal.

4. The amplifier structure of claim 3, wherein to adjust the amplitude of the first amplified output signal, the switching amplifier is further configured to perform one or more of:
 increase the amplitude of the first amplified output signal when the second amplified output signal has a positive amplitude referenced to actual ground; or
 decrease the amplitude of the first amplified output signal when the second amplified output signal has a negative amplitude referenced to actual ground.

5. The amplifier structure of claim 1, wherein the linear amplifier and the switching amplifier are powered by respective power supplies that are electrically isolated from each other.

6. The amplifier structure of claim 1, further comprising a power supply that comprises:
 a primary winding;
 a first secondary winding configured to provide power to the linear amplifier; and
 a second secondary winding electrically isolated from the first secondary winding and configured to provide power to the switching amplifier.

7. The amplifier structure of claim 1, wherein the switching amplifier comprises a full-bridge structure.

8. The amplifier structure of claim 1, wherein the full-bridge structure comprises matched output inductors.

9. The amplifier structure of claim 1, further comprising a feedback path from an output of the switching amplifier configured to output the first amplified output signal, to an input of the linear amplifier;
 wherein the linear amplifier is configured to adjust the value of the reference voltage at the reference node according to at least a feedback signal received by the linear amplifier via the feedback path.

10. The amplifier structure of claim 1, wherein the linear amplifier is configured to:

receive an input signal at the input of the linear amplifier; and generate the second amplified output signal based on the received input signal.

11. The amplifier structure of claim 1, further comprising a filter coupled to:
   an output of the linear amplifier configured to provide the second amplified output signal;
   the reference node; and
   actual ground;
   wherein the filter is configured to enable at least a specified portion of a steady-state current to be provided by the switching amplifier directly from the actual ground.

12. The amplifier structure of claim 11, wherein the filter comprises:
   an inductor coupled across the reference node and the actual ground; and
   a capacitor coupled across the output of the linear amplifier and the reference node.

13. The amplifier structure of claim 11, wherein the specified portion of the steady-state current represents a majority of the steady-state current provided by the switching amplifier.

14. A method for amplifying an input signal, the method comprising:
   generating, by a linear amplifier, a first amplified output signal based at least on the input signal;
   generating, by a switching amplifier, a second amplified output signal based on the first amplified output signal, wherein the second amplified output signal has an amplitude referenced to a value of a reference voltage provided at a reference node for the switching amplifier, wherein the reference voltage provided at the reference node provides a signal reference of the switching amplifier instead of the signal reference of the switching amplifier being provided by actual ground; and
   adjusting, by the linear amplifier, the value of the reference voltage at the reference node responsive to transient changes in the second amplified output signal.

15. The method of claim 14, wherein said adjusting comprises driving, by the linear amplifier, the reference node with the first amplified output signal.

16. The method of claim 14, wherein said adjusting comprises:
   sensing, by the linear amplifier, the transient changes in the second amplified output signal through a feedback path from an output of the switching amplifier; and
   adjusting, by the linear amplifier, the value of the reference voltage at the reference node responsive to said sensing.

17. The method of claim 14, further comprising:
   providing, by the linear amplifier and the switching amplifier, a steady-state current to a load according to at least the second amplified output signal.

18. The method of claim 17, wherein said providing the steady-state current comprises providing, by the switching amplifier, at least a specified portion of the steady-state current directly from actual ground through a filter coupled to the linear amplifier and the switching amplifier.

19. The method of claim 18, wherein said providing the at least a specified portion of the steady-state current comprises providing the specified portion of the steady-state current through an inductor coupled across the reference node and the actual ground.

20. The method of claim 14, further comprising:
   powering the linear amplifier by a first power supply; and
   powering the switching amplifier by a second power supply, wherein the first power supply and the second power supply are electrically isolated.

21. A hybrid amplifier comprising:
   an input terminal configured to receive an input signal;
   an output terminal configured to provide an output signal;
   a linear amplifier stage having an input coupled to the input terminal and configured to:
      receive the input signal;
      generate an intermediate amplified signal based at least on the received input signal; and
      adjust a value of a reference voltage responsive to transient changes in the output signal; and
   a switching amplifier stage coupled to the linear stage and to the output terminal, and configured to generate the output signal based at least on the intermediate amplified signal and the value of the reference voltage, and provide the output signal to the output terminal;
   wherein the output signal has an amplitude referenced to the value of the reference voltage, wherein the reference voltage provides a signal reference of the switching amplifier stage instead of the signal reference of the switching amplifier stage being provided by actual ground.

22. The hybrid amplifier of claim 21, further comprising a reference node providing the reference voltage for the switching amplifier stage;
   wherein to adjust the value of the reference voltage, the linear amplifier stage is further configured to drive the reference node with the intermediate amplified output signal.

23. The hybrid amplifier of claim 22, wherein the output terminal is coupled to the reference node via a capacitor.

24. The hybrid amplifier of claim 21, wherein the switching amplifier stage is further configured to perform one or more of:
   increase the amplitude of the output signal when the intermediate amplified signal has a positive amplitude referenced to actual ground; or
   decrease the amplitude of the output signal when the intermediate amplified signal has a negative amplitude referenced to actual ground.

25. The hybrid amplifier of claim 21, wherein the linear amplifier stage and the switching amplifier stage are powered independently from each other.

26. The hybrid amplifier of claim 21, wherein the linear amplifier stage and the switching amplifier stage are powered by a power supply comprising:
   a primary winding;
   a first secondary winding configured to power the linear amplifier stage according to a current developed in the primary winding; and
   a second secondary winding electrically isolated from the first secondary winding and configured to provide power to the switching amplifier stage according to the current developed in the primary winding.

27. The hybrid amplifier of claim 21, wherein the switching amplifier stage comprises a full-bridge structure.

28. The hybrid amplifier of claim 21, wherein the full-bridge structure comprises matched output inductors.

29. The hybrid amplifier of claim 21, further comprising:
   a feedback path from the output terminal to the input of the linear amplifier;
   wherein the linear amplifier stage is configured to sense the transient changes in the output signal via the feedback path.

30. The hybrid amplifier of claim 21, further comprising a high-pass filter coupled to:
- an output of the linear amplifier stage configured to provide the intermediate amplified signal;
- a reference node providing the reference voltage; and actual ground;
- wherein the high-pass filter is configured to enable the switching amplifier stage to provide at least a specified portion of a steady-state current directly from the actual ground.

31. The hybrid amplifier of claim 30, wherein the high-pass filter comprises:
- an inductor coupled across the reference node and the actual ground; and
- a capacitor coupled across the output of the linear amplifier and the reference node.

32. The hybrid amplifier of claim 30, wherein the specified portion of the steady-state current represents a majority of the steady-state current provided by the switching amplifier stage.

* * * * *